United States Patent [19]
Chiang et al.

[11] Patent Number: 5,302,866
[45] Date of Patent: Apr. 12, 1994

[54] INPUT CIRCUIT BLOCK AND METHOD FOR PLDS WITH REGISTER CLOCK ENABLE SELECTION

[75] Inventors: David Chiang, Saratoga; Thomas Y. Ho, Milpitas; Jeffrey H. Seltzer; Jeffrey Goldberg, both of San Jose, all of Calif.

[73] Assignee: Xilinx, Inc., San Jose, Calif.

[21] Appl. No.: 32,919

[22] Filed: Mar. 18, 1993

[51] Int. Cl.⁵ ............................................. H03K 3/289
[52] U.S. Cl. ................................ 307/465; 307/272.2; 307/475; 307/480
[58] Field of Search ................. 307/443, 465, 465.1, 307/475, 272.2, 480

[56] References Cited

U.S. PATENT DOCUMENTS

| | | | |
|---|---|---|---|
| 4,942,318 | 7/1990 | Kawana | 307/465 |
| 4,992,679 | 2/1991 | Takata et al. | 307/465 |
| 5,023,484 | 6/1991 | Pathak et al. | 307/480 X |
| 5,198,705 | 3/1993 | Galbraith et al. | 307/465 |

*Primary Examiner*—David R. Hudspeth
*Attorney, Agent, or Firm*—Edel M. Young; Norman R. Klivans

[57] ABSTRACT

An input block for PLDs programmable logic devices) has a flip-flop including a master latch and a slave latch, a pad for inputting data, configuration bits, and a global clock input signal for clocking the input data to the flip-flop means. The flip-flop is controlled by the configuration bits so as to function alternatively as a register, a latch or transparently. The input block further includes at least one clock enable signal input terminal and logic elements responding to the configuration bits for providing the clock enable signal for the register function as well as the latch function of the flip-flop.

20 Claims, 5 Drawing Sheets

| CB3 | DATA INPUT | OUTPUT OF XOR1 |
|---|---|---|
| 0 | 0 | 0 |
| 0 | 1 | 1 |
| 1 | 0 | 1 |
| 1 | 1 | 0 |

FIG. 1B

| CB1 OR MC2 | CB0 OR MC3 | FUNCTION |
|---|---|---|
| 0 | 0 | TRANSPARENT |
| 0 | 1 | POSITIVE-CLOCKED-LATCH |
| 1 | 0 | NEGATIVE-CLOCKED-LATCH |
| 1 | 1 | REGISTER |

FIG. 1C

INPUT CIRCUIT BLOCK AND METHOD FOR PLDS WITH REGISTER CLOCK ENABLE SELECTION

FIELD OF THE INVENTION

This invention relates to integrated circuit programmable logic devices (PLDs), more particularly to an input block for PLDs with invert/register/latch capability and register clock enable selection.

BACKGROUND OF THE INVENTION

I/O blocks used in PLDs provide the interface between external integrated circuit package pins and the internal logic, and are user-configurable. Each I/O block controls one package pin, hence one pad of the integrated circuit die, and can be defined for input, output or bidirectional signals.

FIG. 1(A) depicts a prior art I/O block which is defined as an input block with invert/register/latch capability. In FIG. 1(A), the input register IR (dotted line) consists of two stages ML and SL. ML represents a master latch and SL represents a slave latch. (A latch is a device which in a transparent mode forwards input data to its output and in a latched mode presents at its output a signal which was present at its input when the latch switched modes. Two latches in series which are always in opposite modes form a flip flop or register.) M1–M3 represent multiplexers or signal path selectors. Configuration bits CB0–CB3, which may come from a conventional configuration register (not shown) determine which input path of the multiplexers will go to the output thereof respectively. Configuration bit CB3 forms one of the two inputs of gate XOR1, and the other input of gate XOR1 is the input data coming from the PAD. Configuration bit CB3 determines whether the input data is to be inverted or not before entering the latches. When CB3 is logic value "1", the output of gate XOR1 is inverted input data, while when CB3 is logic value "0" the output of the gate XOR1 is in phase with the input data (non-inverted). The logic function of gate XOR1 is shown in the truth table of FIG. 1(B), which shows the inversion selection of the input data by configuration bit CB3. Global clocks CLK1 and CLK0 are typically connected to alternative sources of clock signals, for example an external clock signal which is distributed globally through the chip, and an internal clock signal which may be distributed globally or may be a different signal for different parts of the chip. Internal clock signals in a device which includes programmable macrocells or logic blocks may be generated by one of these programmable macrocells or logic blocks and used as a clock signal for controlling other macrocells or logic blocks.

FIG. 1(C) shows the functions of the register under four different combinations of configuration bits CB0 and CB1. When both CB0 and CB1=0, the state of the master and slave latches (the values in their Q outputs) follow their D inputs (the register is transparent). When CB0=1 and CB1=0 the master latch is always transparent and the slave latch responds to the clock signal as follows: when the clock signal is low, the slave latch provides on its output the value of the input present when the clock signal goes from high to low; when the clock signal is high, the slave latch passes its input signal to its output. When CB0=0 and CB1=1, the slave latch is always transparent and the master latch latches its input every time the clock pulse rises from low to high level. The register is referred to as being in a negative-enabled-latch mode. The other instance is CB0=1 and CB1=1, when the register is in a positive-edge-triggered mode. In this mode, the master latch latches its input (i.e., the output of gate XOR1 at the rising edge of the clock signal (clock signal is selected by CB2), and the slave latch latches the output state of the master latch at the falling edge of the clock signal.

This input register/latch is used as a storage register that is connected to a bus, with a data strobe used as a clock signal to control when the data should be registered. However, it is awkward to achieve a desired register control when the register is directly controlled by clock signals because the register accepts new data unconditionally on each clock cycle. The device needs increased flexibility.

SUMMARY OF THE INVENTION

Accordingly, one object of this invention is to provide an input circuit block which incorporates optional selection of clock enable signals for a register.

Another object of this invention is to provide an input circuit block wherein the clock enable signal may be driven externally or as an output of another part of the same device (for example, the output of a macrocell in the device).

In accordance with the present invention, an input block for EPLDs has a flip-flop circuit (or a register circuit) including a master latch and a slave latch, a pad (for inputting data), configuration bits, and global clock terminals (for clocking input data to the flip-flop circuit). The flip-flop circuit is controlled by the configuration bits so as to function alternatively as a register, a latch, or a transparent buffer. The input block further includes at least one clock enable signal terminal and logic elements responding to the configuration bits for providing the clock enable signal for the register function of the flip-flop circuit.

In a further embodiment of the present invention, the input block includes logic elements responding to the configuration bits for providing the clock enable signal not only for the register function, but also for the latch function of the flip-flop circuit. Clock enable signals can be selected by the configuration bits to choose one as the clock enable signal for the flip-flop circuit. Those clock enable signals may be driven externally or may be a product-term output, or other internal signals, or be outputs of macrocells, or may be a user-programmable selection of the above.

This added flexibility allows the device to be used for a broader range of applications. Also, because the added functionality is provided by the I/O blocks rather than the programmable macrocells of the device, more macrocells remain available for the user to implement other logic functions, thereby allowing the device to achieve higher density. Also, the clock enable function can be performed at higher speed in the I/0 block than in macrocells interior to the device.

BRIEF DESCRIPTION OF THE DRAWINGS

FIG. 1(B) is a truth table of the XOR gate.

FIG. 1(C) is a function table of the flip-flop circuit in FIG. 1(A) with different combinations of values of the control bits CB0 and CB1.

DETAILED DESCRIPTION

Figure 1A:
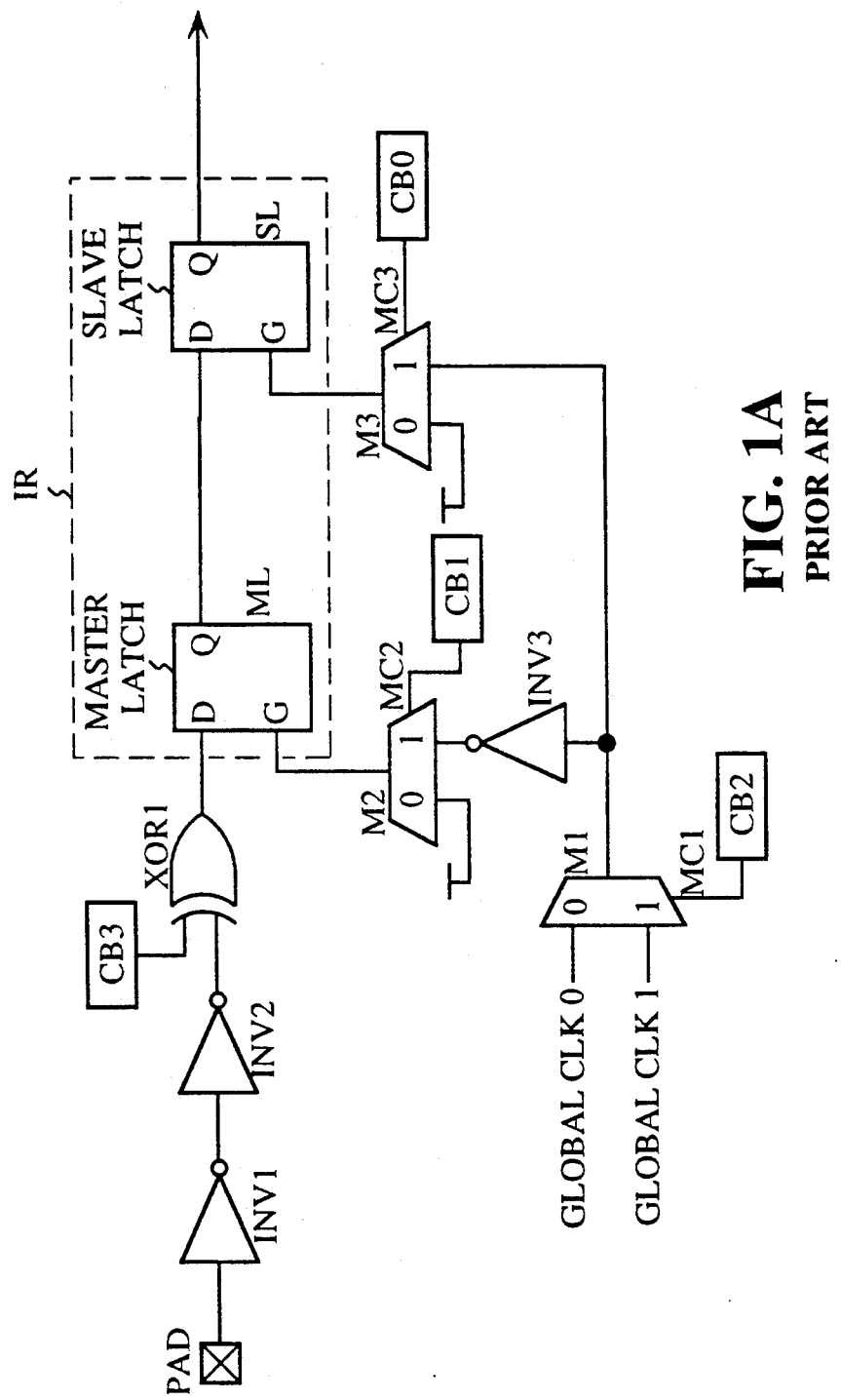
FIG. 1(A) shows a prior art input block.
Figure 2A:
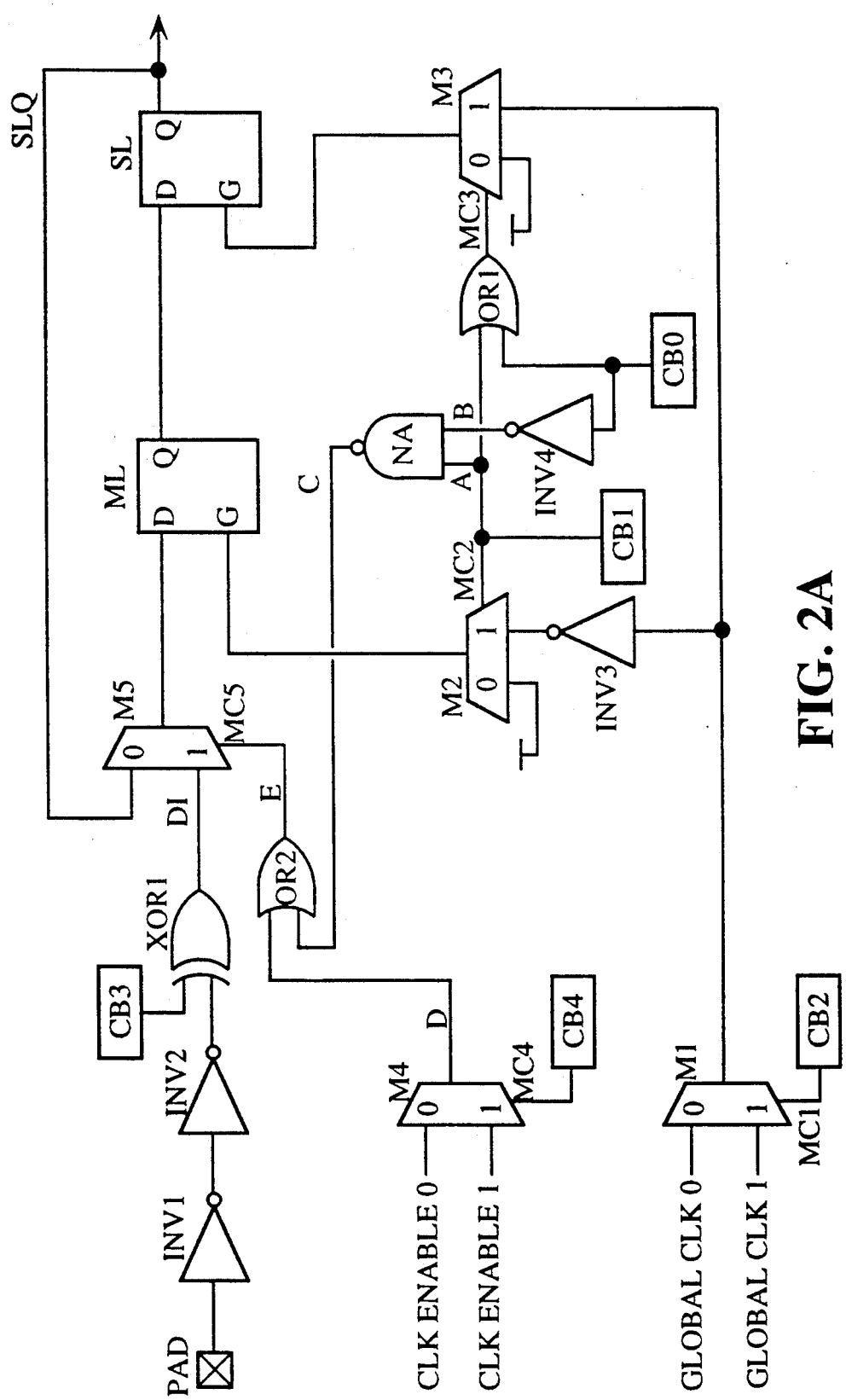
FIG. 2(A) shows an input block with logic elements for providing clock enable signals for the register function of the flip-flop circuit in accordance with one embodiment of the present invention.

Reference is now made to FIG. 2(A), where logic elements including multiplexers M4, M5, OR gates OR1, OR2, NAND gate NA and an additional inverter INV4 are introduced into the input block shown in FIG. 1(A). Inputs A and B of gate NA are CB1 and $\overline{CB0}$ respectively (due to the inverter connected between CB0 and the NAND gate input terminal). The output C of NAND gate NA is ORed with the output D of multiplexer M4 by OR gate OR2. The output of OR gate OR2 forms the control input MC5 of multiplexer M5 to select the data signal input DI or the output SLQ of the slave latch as the data input of the master latch. Therefore, the output C of NAND gate NA is $\overline{CB1 \cdot CB0}$. The output C of NAND gate NA is asserted as logic "0" if and only if CB1=1 and CB0=0, and is asserted as logic "1" for all other combinations of CB1 and CB0.

tions of the flip-flop circuit shown in FIG. 2(A) with different combination of values of CB1 and CB0 are set forth in Table 1:

TABLE 1

| CB1 | CB0 | $\overline{CB0}$ | MC2 | MC3 | C | D | MC5 (E) | Function |
|---|---|---|---|---|---|---|---|---|
| 0 | 0 | 1 | 0 | 0 | 1 | X | 1 | Transparent |
| 0 | 1 | 0 | 0 | 1 | 1 | X | 1 | Positive-clocked-latch |
| 1 | 0 | 1 | 1 | 1 | 0 | X | D | Register with CLK enable |
| 1 | 1 | 0 | 1 | 1 | 1 | X | 1 | Register | where MC2, MC3 and MC5 represents the control inputs of multiplexers M2, M3, and M5 respectively, and X represents either logic value 1 or 0.

When CB1 and CB0 are both logic "0", multiplexers M2 and M3 each select the signal path labeled 0, and multiplexer M5 selects the output of gate XOR1 as its output because output C of NAND gate NA is logic value "1" for this combination of CB1 and CB0, and the control of multiplexer M5 therefore is logic value "1". The circuit behaves the same as that in FIG. 1(A) for the same combination of CB1 and CB0. The register or flip-flop circuit is therefore transparent. When CB1 and CB0 are both logic value "1", multiplexers M2 and M3 each select the signal path labeled 1, and multiplexer M5 again selects the output of gate XOR1 as its output. The circuit behaves the same as that in FIG. 1(A) for the same values of CB1 and CB0, and the flip-flop circuit functions as a register. When CB1=0 and CB0=1, the flip-flop circuit acts as a positive-clocked-latch, similar to what happens in FIG. 1(A) under the same values of CB1 and CB0. When CB1=1 and CB0=0, multiplexer M2 selects signal path 1 because CB1=1, and multiplexer M3 also selects signal path 1 despite CB0=0, because control input MC3 of the multiplexer M3 is the output of OR gate OR1. Therefore, the flip-flop circuit functions as an edge triggered register as would the circuit of FIG. 1(A) if CB1=1 and CB0=1 with the following exception. Output C of NAND gate NA is logic value 0, and output E of the gate OR2, as set forth in Table 1 depends on the output D of multiplexer M4. Therefore, the selection of the signal path through multiplexer M5 into the D input of master latch ML is now dependent on the clock enable signal from multiplexer M4. Thus the function of the flip-flop circuit when CB1=1 and CB0=0 is as a register with clock enable. This function was not available in the prior art circuit of FIG. 1(A). Multiplexer M4 controlled by configuration bit CB4 provides a selection between clock enable signals CLK ENABLE 0 and CLK ENABLE 1.

These clock enable signals CLK ENABLE 0 and CLK ENABLE 1 may be driven externally, or may be product-term outputs or other internal signals, or outputs of on-chip macrocells. The clock enable signal may be a user-programmable selection of the above-mentioned signals.

Figure 2B:
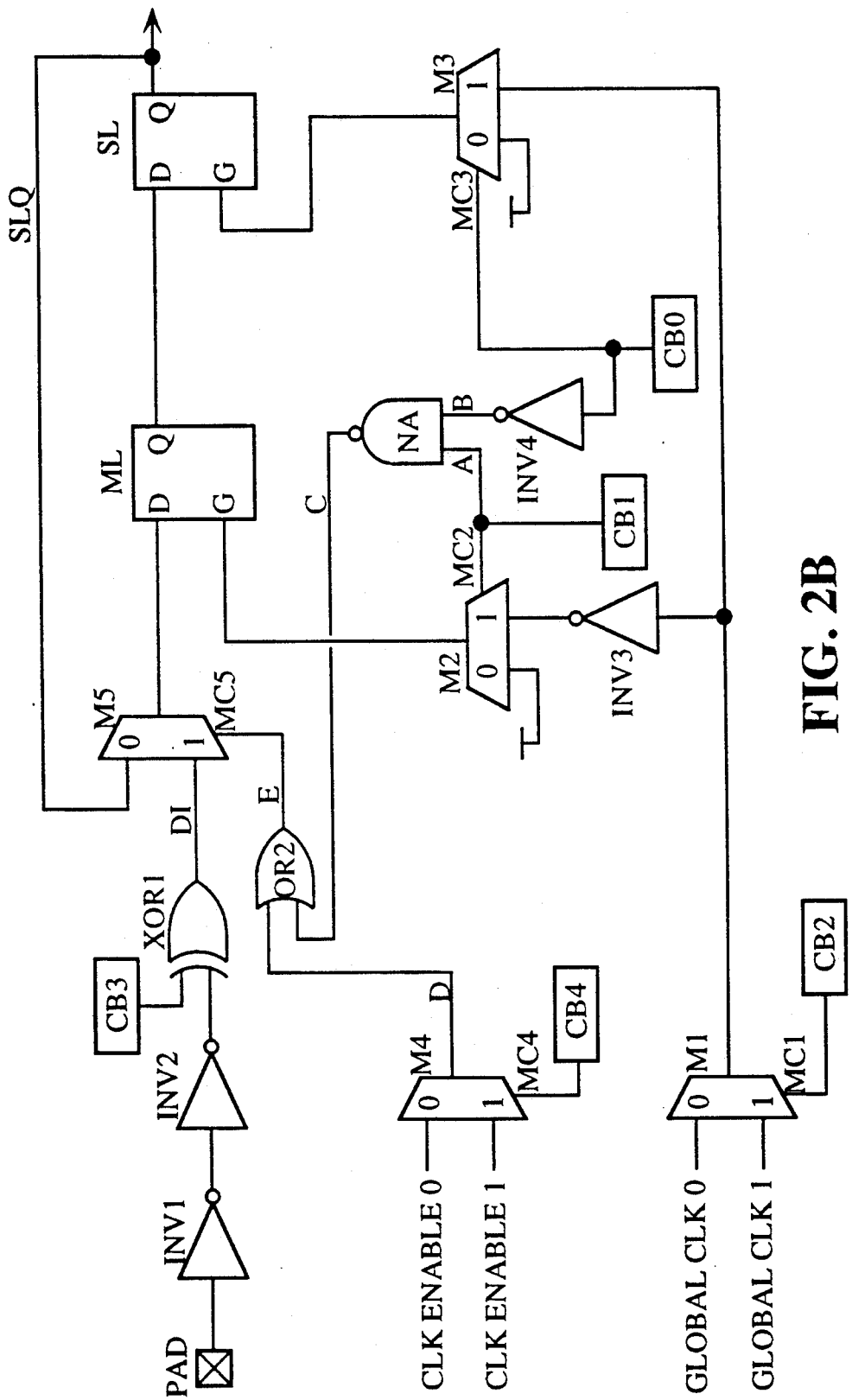
FIG. 2(B) is an input block with logic elements for providing clock enable signals for the latch function of the flip-flop circuit.

In FIG. 2(B), gate OR1 is eliminated from the input block shown in FIG. 2(A) and CB1 becomes the control input MC3 of the multiplexer M3. The truth table of the logic elements and the functions of the flip-flop circuit with different combination of values of CB1 and CB0 are set forth in Table 2:

TABLE 2

| CB1 | CB0 | $\overline{CB0}$ | MC2 | MC3 | C | D | MC5 (E) | Function |
|---|---|---|---|---|---|---|---|---|
| 0 | 0 | 1 | 0 | 0 | 1 | X | 1 | Transparent |
| 0 | 1 | 0 | 0 | 1 | 1 | X | 1 | Positive-clocked-latch |
| 1 | 0 | 1 | 1 | 0 | 0 | X | D | Negative-clocked-latch with Clk enable. |
| 1 | 1 | 0 | 1 | 1 | 1 | X | 1 | Register |

The clock enable signal functions only when it controls the output of OR gate OR2, i.e., when output C of NAND gate NA is logic value 0, which happens when CB1=1 and CB0=0. However, the combination CB1=1 and CB0=0 causes multiplexer M2 to output the inverted clock signal (via INV3) and multiplexer M3 to output logic value 1. The flip-flop circuit with such MC2 and MC3 values functions as a negative-clocked-latch as described in conjunction with FIG. 1(A) and the function table of FIG. 1(C). Therefore, the input block shown in FIG. 2(B) can be configured to function as a negative-clocked-latch with clock enable signal. Again, this function was not available in the prior art circuit of FIG. 1(A).

Figure 2C:
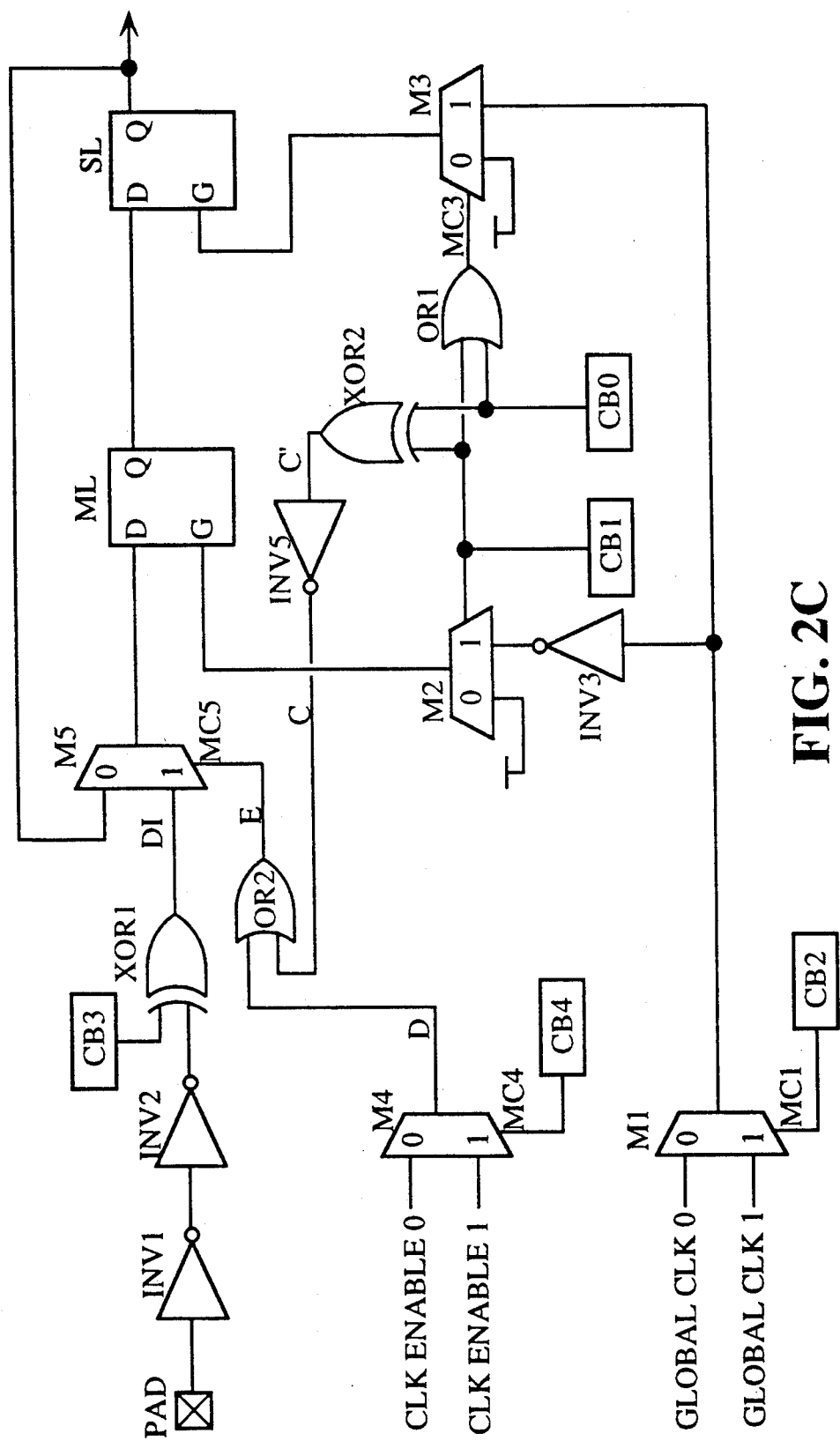
FIG. 2(C) is an input block with logic elements for providing clock enable signals for the latch function as well as the register function of the flip-flop circuit, in accordance with another embodiment of the present invention.

FIG. 2(C) shows an embodiment in which inverter INV4 and NAND gate NA in FIG. 2(A) are replaced by XOR gate XOR2 followed by inverter INV5. In FIG. 2(C) this inverting function is provided by XOR gate XOR2. After a similar analysis, the input block under this circumstance functions the same as that shown in FIG. 2(A) except that when CB1=0 and CB0=1 the input block now functions as a positive-clocked latch with clock enable signal.

Clock enable signals can also be made available to both the register and latch function of the flip-flop circuit. As shown in FIG. 2(C), the configuration bits CB1 and CB2 form the inputs of the XOR gate XOR2, and the output C' is asserted as being logic value 1 when CB1 and CB2 are different. The truth table of the logic elements and the functions of the flip-flop circuit with different combination of values of CB1 and CB0 are set forth in Table 3:

TABLE 3

| CB1 | CB0 | CB0 | MC2 | MC3 | C | D | MC5 (E) | Function |
|---|---|---|---|---|---|---|---|---|
| 0 | 0 | 0 | 0 | 0 | 1 | X | 1 | Transparent |
| 0 | 1 | 0 | 1 | 1 | 0 | X | D | Positive-clocked-latch with clock enable |
| 1 | 0 | 1 | 1 | 1 | 0 | X | D | Register with Clk enable. |
| 1 | 1 | 0 | 1 | 1 | 1 | X | 1 | Register |

By using the similar analysis set forth above, it is concluded that the input block shown in FIG. 2(C) functions as a positive-clocked-latch with clock enable when CB1=0 and CB0=1, and as an edge triggered register with clock enable when CB1=1 and CB0=0.

Besides, more than one such input block may be driven by a data signal from a single pad to provide multiple functions of that data signal.

Although the present invention has been described and illustrated in detail it is to be understood that this is an example only and is not to be taken as a limitation. Different logic elements can be used in the circuits FIGS. 2(A), 2(B), and 2(C) to provide clock enable signals for the particular functions, as is apparent to those of ordinary skill in the art. The spirit and scope of the present invention is limited only by the terms of the appended claims.

What we claim is:

1. An input block for programmable logic devices, comprising:
    a flip-flop circuit (IR) including a master latch (ML) and a slave latch (SL),
    means (DI) for inputting a data signal into said flip-flop circuit,
    means (M1) for providing a global clock signal for clocking said data signal input to said flip-flop circuit,
    a clock enable terminal (E), and
    at least one configuration terminal (CB1, CB0) for providing at least one configuration signal to said flip flop circuit,
    logic elements (OR2, NA, INV4, XOR2, INV5) responsive to said at least one configuration signal for providing a clock enable signal (D) on said clock enable terminal.

2. An input block for programmable logic devices as in claim 1 wherein said logic elements provide said clock enable signal (D) to said clock enable terminal (E) when said flip-flop circuit is configured to operate as a register.

3. An input block for programmable logic devices as in claim 1 further comprising:
    means (M2, M3, INV3, OR1) for causing said flip-flop circuit to function alternatively as one of a register, a latch and a transparent function in response to said configuration signals, 4. An input block as in claim 1, wherein said logic elements comprise means (M4) controlled by the configuration signals (CB4) for selecting one of a plurality of clock enable signals (CLK ENABLE0, CLK ENABLE1) as said clock enable signal.

5. An input block as in claim 4, wherein said clock enable signals are selected from a group including product-term output internal signals, macrocell output internal signals, and externally provided signals.

6. An input block as in claim 1, wherein said configuration signals are user-programmable.

7. An input block as in claim 1, further comprising means (XOR1) controlled by said configuration signals (CB3) for selective inverting of said data input before sending said data input to said flip-flop circuit.

8. An input block as in claim 1, wherein said configuration signals comprise a first configuration signal (CB1) and a second configuration signal (CB0) for controlling the functions of the flip-flop circuit, and said logic elements comprise a first portion (OR2,NA,INV4 or OR2,INV5,XOR2) controlled by said first and second configuration signals for producing a third control signal (C) which is asserted if and only if said flip-flop circuit functions as a register.

9. An input block as in claim 8, wherein said first portion comprises a two-input NAND gate (NA), one of the input signals of the NAND gate being via an inverter (INV4) connected to the first configuration signal (CB0), the other input signal of the NAND gate being the second configuration signal (CB1), and the output signal of the NAND gate (C) forming said control signal.

10. An input block as in claim 9, wherein said logic elements further comprise a second portion (OR2) controlled by said control signal (C) for providing said clock enable signal (D) for the register function of the flip-flop circuit.

11. An input block as in claim 10, wherein said second portion comprises
    a two-to-one multiplexer (M5) with two data input terminals and a control input terminal, one of the data input terminals being driven from the output (SLQ) of the slave latch, the other data terminal being driven by the data signal;
    an OR gate (OR2) having two input terminals and an output terminal, one input terminal of the OR gate being driven by said clock enable signal (D), the other input terminal of the OR gate being driven by said control signal (C), and the output terminal of the OR gate driving said control input terminal of the multiplexer.

12. An input block for programmable logic devices, having a flip-flop circuit including a master latch and a slave latch, a terminal for inputting a data signal, configuration signals, and a global clock signal for clocking data input to said flip-flop circuit, said flip-flop circuit being controlled by the configuration signals to function alternatively as one of a register, a latch and transparent function, said input block comprising a clock enable signal terminal and logic elements responding to said configuration signals for providing the clock enable signal for the register function and the latch function of the flip-flop circuit.

13. An input block as in claim 12, wherein said logic elements comprise means controlled by the configuration signals for selecting one of a plurality of clock enable signals as said clock enable signal.

14. An input block as in claim 13, wherein said plurality of clock enable signals include product-term outputs, internal signals, an output of a macrocell and externally provided signals.

15. An input block as in claim 12, wherein said configuration signals are user-programmable.

16. An input block as in claim 12, further comprising selection means controlled by said configuration signals for selective inverting of said data input before sending said data input to said flip-flop circuit.

17. An input block as in claim 12, wherein said configuration signals comprise a first configuration signal and a second configuration signal for controlling the functions of the flip-flop circuit, and said logic elements comprise a first portion controlled by said first and second configuration signals for producing a control signal which is asserted if and only if said flip-flop circuit functions as a register or a latch.

18. An input block as in claim 17, wherein said first portion comprises a two-input XOR gate, the two input signals of the XOR gate being the first and second configuration signals respectively, the inverted output signal of the XOR gate being said control signal.

19. An input block as in claim 18, wherein said logic elements further comprise a second portion controlled by said control signal for providing said clock enable signal for the register function and latch function of the flip-flop circuit.

20. An input block as in claim 19, wherein said second portion comprises a two-to-one multiplexer with two data input signals and a control input signal, one of the data input signals being the output of the slave latch, the other data input signal being the data signal; a two-input OR gate, one of the input signals of the OR gate being said clock enable signal, the other input signal of the OR gate being to said control signal, and the output signal of the OR gate being said control input of the multiplexer.

* * * * *

UNITED STATES PATENT AND TRADEMARK OFFICE
CERTIFICATE OF CORRECTION

PATENT NO. : 5,302,866
DATED : April 12, 1994
INVENTOR(S) : David Chiang, Thomas Y. Ho, Jeffrey H. Seltzer, and Jeffrey Goldberg It is certified that error appears in the above-identified patent and that said Letters Patent is hereby corrected as shown below:

In the Abstract, line 1, "PLDs programmable" should read --PLDs (programmable--.

Col. 2, line 5, "XOR1 at" should read --XOR1) at--.

Col. 3, line 26, "$\overline{CB1 \cdot CB0}$" should read --$\overline{CB1} \cdot \overline{CB0}$--.

Col. 3, line 30, "tions of" should read --The truth table of the logic elements and the functions of--.

Col. 4, line 28, "CB0" (second occurrence) should read --$\overline{CB0}$--.

Col. 5, line 3, "CB0" (second occurrence) should read --$\overline{CB0}$--.

Signed and Sealed this

Twelfth Day of September, 1995

Attest:

BRUCE LEHMAN

Attesting Officer

Commissioner of Patents and Trademarks